United States Patent
Lin et al.

(10) Patent No.: US 8,300,461 B2
(45) Date of Patent: Oct. 30, 2012

(54) AREA SAVING ELECTRICALLY-ERASABLE-PROGRAMMABLE READ-ONLY MEMORY (EEPROM) ARRAY

(75) Inventors: Hsin Chang Lin, Hsinchu County (TW); Chia-Hao Tai, Hsinchu County (TW); Yang-Sen Yen, Hsinchu County (TW); Ming-Tsang Yang, Hsinchu County (TW); Ya-Ting Fan, Hsinchu County (TW)

(73) Assignee: Yield Microelectronics Corp., Hsinchu County (TW)

( * ) Notice: Subject to any disclaimer, the term of this patent is extended or adjusted under 35 U.S.C. 154(b) by 228 days.

(21) Appl. No.: 12/862,082

(22) Filed: Aug. 24, 2010

(65) Prior Publication Data

US 2012/0051147 A1 Mar. 1, 2012

(51) Int. Cl.
*G11C 11/34* (2006.01)

(52) U.S. Cl. ......... 365/185.05; 365/185.11; 365/185.18; 365/185.24; 365/185.27; 365/185.29; 365/185.33

(58) Field of Classification Search ............. 365/185.05, 365/185.11, 185.18, 185.24, 185.27, 185.29, 365/185.33
See application file for complete search history.

(56) References Cited

U.S. PATENT DOCUMENTS

| | | | | |
|---|---|---|---|---|
| 5,912,843 A * | 6/1999 | Jeng | ............... | 365/185.29 |
| 6,232,634 B1 * | 5/2001 | Wu et al. | ............... | 365/185.05 |
| 6,330,184 B1 * | 12/2001 | White et al. | ............... | 365/185.18 |
| 6,519,184 B2 * | 2/2003 | Tanaka et al. | ............... | 365/185.18 |
| 6,731,544 B2 * | 5/2004 | Han et al. | ............... | 365/185.18 |
| 6,747,899 B2 * | 6/2004 | Hsia et al. | ............... | 365/185.18 |
| 6,992,936 B2 * | 1/2006 | Tsujikawa et al. | ....... | 365/185.29 |
| 7,301,818 B2 * | 11/2007 | Lu et al. | ............... | 365/185.24 |
| 7,339,231 B2 * | 3/2008 | Katayama | ............... | 365/185.05 |

* cited by examiner

*Primary Examiner* — Trong Phan
(74) *Attorney, Agent, or Firm* — Rosenberg, Klein & Lee

(57) ABSTRACT

An area saving electrically-erasable-programmable read-only memory (EEPROM) array, having: a plurality of parallel bit lines, a plurality of parallel word lines, and a plurality of parallel common source lines. The bit lines are classified into a plurality of bit line groups, containing a first group bit line and a second group bit line; the word line includes a first word line; and the common source lines include a first common source line. In addition, a plurality of sub-memory arrays are provided. Each sub-memory array contains a first, second, third, and fourth memory cells. Wherein, the first and second memory cells are symmetrically arranged, and the third and fourth memory cells are symmetrically arranged; also, the first and second memory cells, and the third and fourth memory cells are symmetrically arranged with the first common source line as a symmetric axis.

23 Claims, 13 Drawing Sheets

AREA SAVING ELECTRICALLY-ERASABLE-PROGRAMMABLE READ-ONLY MEMORY (EEPROM) ARRAY

BACKGROUND OF THE INVENTION

1. Field of the Invention

The present invention relates to a memory array, and in particular to an area saving electrically-erasable-programmable read-only memory (EEPROM) array.

2. The Prior Arts

Presently, in the semiconductor industry, Complementary Metal Oxide Semiconductor (CMOS) manufacturing process has become an ordinary manufacturing method for Application Specific Integrated Circuit (ASIC). With the rapid progress and development of the computer and information industries, Flash memory and electrically-erasable-programmable read-only memory (EEPROM) have been widely utilized in various electronic products for its non-volatile memory capability of being electrically programmable and erasable, such that data stored therein will not be lost, even when its power supply is turned off.

In general, a non-volatile memory is programmable, and the memory stores charges in order to change the gate voltage of a transistor in the memory, or the memory will not store charges, such that the gate voltage remains unchanged as the original gate voltage of the transistor in the memory. For an erasure operation, the charges stored in the non-volatile memory are removed, such that the gate voltage of the transistor in the memory will return to its original value. Refer to FIGS. 1 & 2 for a circuit diagram of a non-volatile memory according to the prior art, and a circuit diagram of a non-volatile memory layout according to the prior art respectively. As shown in FIGS. 1 & 2, the non-volatile memory is composed of a plurality of memory cells. Wherein, each memory cell includes a transistor 10 and a capacitor 12, between two adjacent byte-memory cells is provided with two bit lines BL1 and BL2, such that the area occupied is increased. Moreover, refer to FIG. 3 for a cross section view of a memory cell of a non-volatile memory according to the prior art, as shown in FIG. 3, the capacitor 12 is located at one side of the transistor 10, since this kind of structure occupies large area, it will further raise the cost.

Therefore, presently, the area occupied by the memory cells of a non-volatile memory is rather large, and it has much room for improvement.

SUMMARY OF THE INVENTION

In view of the problems and shortcomings of the prior art, the present invention provides an area saving electrically-erasable-programmable read-only memory (EEPROM) array, that is capable of solving the problems of the prior art.

A major objective of the present invention is to provide an area saving electrically-erasable-programmable read-only memory (EEPROM) array, which is capable of reducing the area occupied by the memory cell, hereby reducing its cost.

In order to achieve the above mentioned objective, the present invention provides an area saving electrically-erasable-programmable read-only memory (EEPROM) array, comprising: a plurality of parallel bit lines, parallel word lines, and parallel common source lines. The plurality of bit lines are classified into a plurality groups of bit lines, containing a first group bit line and a second group bit line; a plurality of parallel word lines, arranged perpendicular to the bit lines, and containing a first word line; a plurality of parallel common source lines, arranged parallel to the word lines, and containing a first common source line; and a plurality of sub-memory arrays, each connected to two group of bit lines, a word line, and a common source line. Each sub-memory array includes a first, second, third, and fourth memory cells. Wherein, the first memory cell is connected to a first group bit line, a first common source line, and a first word line; and the second memory cell is connected to a second group bit line, a first common source line, and a first word line; the first memory cell and the second memory cell are arranged to be symmetric to each other, and are located on the same side of the first common source line. The third memory cell is connected to a first group bit line, a first common source line, and a first word line, and is arranged to be symmetric to the first memory cell with the first common source line as a symmetric axis; and the fourth memory cell is connected to a second group bit line, a first common source line, and a first word line, and is arranged to be symmetric to the second memory cell with the first common source line as a symmetric axis; the third memory cell and the fourth memory cell are arranged to be symmetric to each other, and are located on two different sides of the first common source line similar to that of the first and second memory cells.

Further scope of the applicability of the present invention will become apparent from the detailed descriptions given hereinafter. However, it should be understood that the detailed descriptions and specific examples, while indicating preferred embodiments of the present invention, are given by way of illustration only, since various changes and modifications within the spirit and scope of the present invention will become apparent to those skilled in the art from this detailed descriptions.

BRIEF DESCRIPTION OF THE DRAWINGS

The related drawings in connection with the detailed descriptions of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings.

Figure 1:
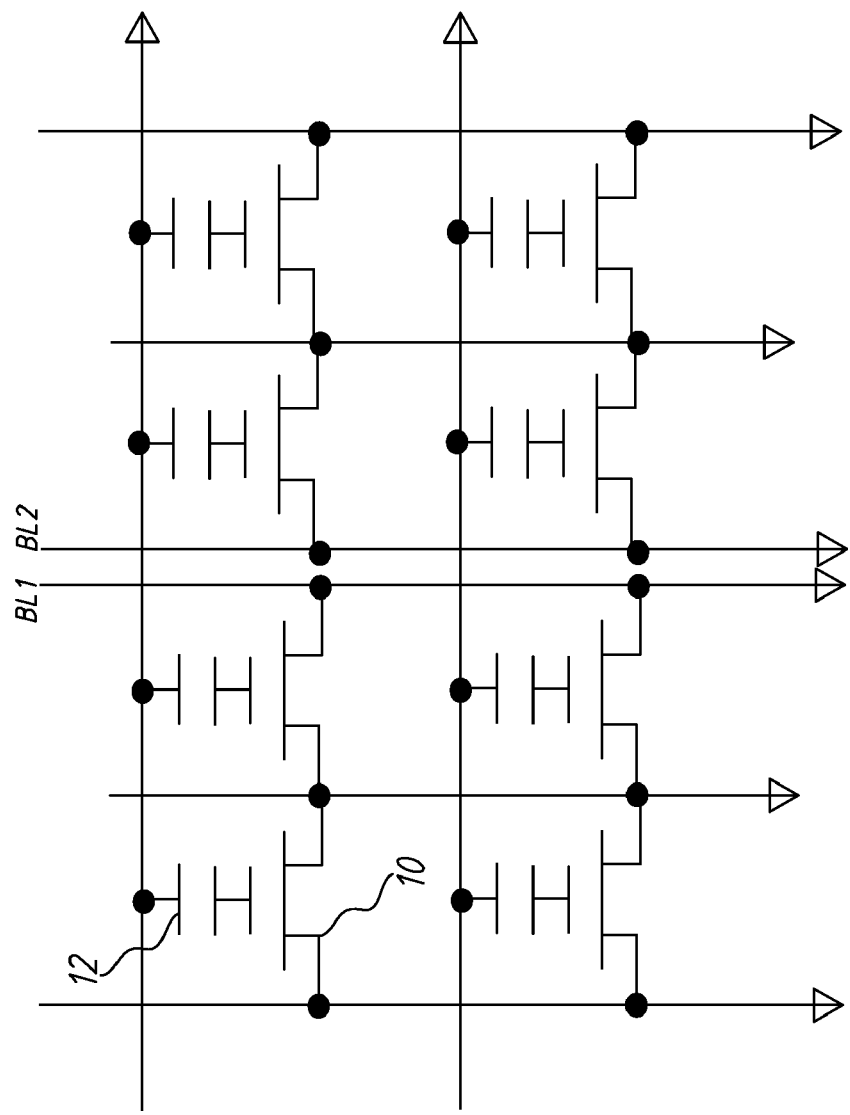
FIG. 1 is a circuit diagram of a non-volatile memory according to the prior art.
Figure 2:
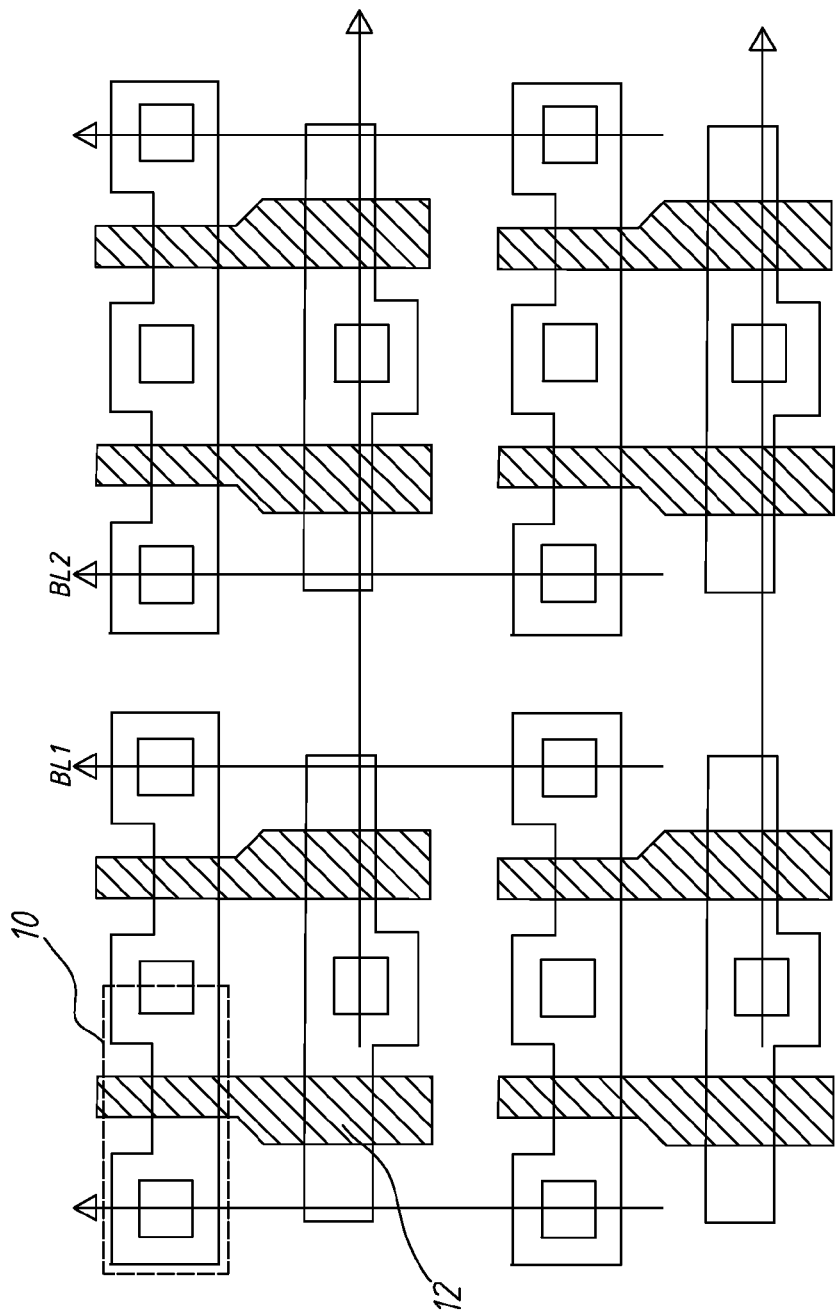
FIG. 2 is a circuit diagram of a non-volatile memory layout of FIG. 1 according to the prior art.
Figure 3:
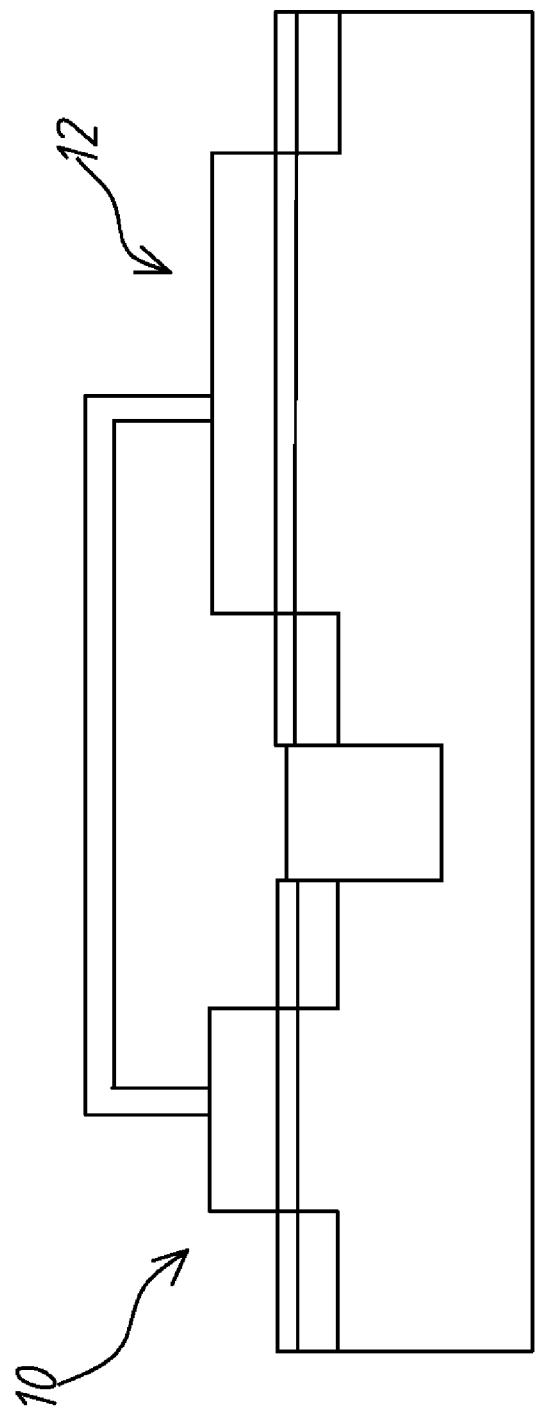
FIG. 3 is a cross section view of a memory cell of a non-volatile memory according to the prior art.
Figure 4:
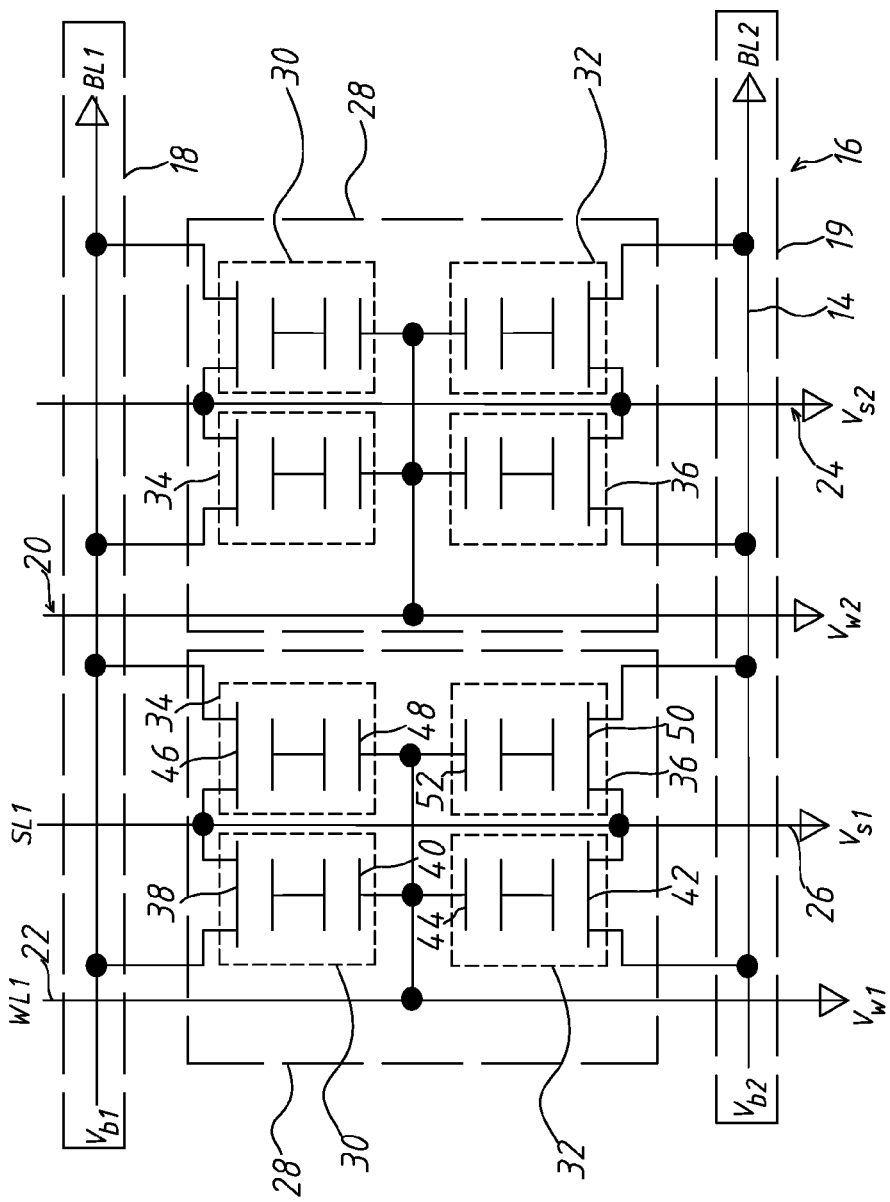
FIG. 4 is a circuit diagram of an area saving electrically-erasable programmable read-only memory (EEPROM) array according to a first embodiment of the present invention.
Figure 5:
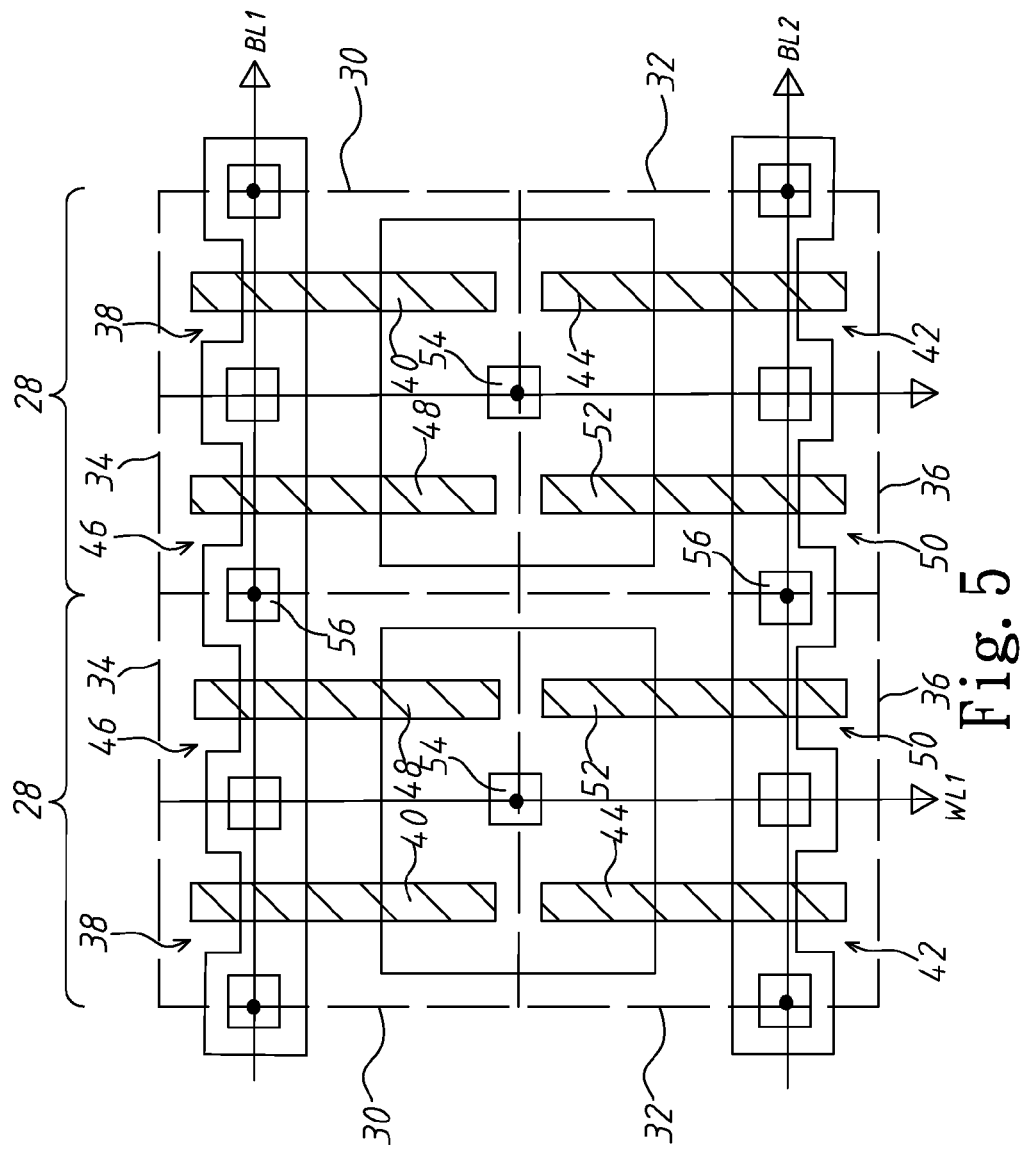
FIG. 5 is a circuit diagram of an area saving electrically-erasable programmable read-only memory (EEPROM) array layout according to a first embodiment of the present invention.

Firstly, for explaining the first embodiment of the present invention, refer to FIG. 4 for a circuit diagram of an area saving electrically-erasable programmable read-only memory (EEPROM) array according to a first embodiment of the present invention, and FIG. 5 for a circuit diagram of an area saving electrically-erasable programmable read-only memory (EEPROM) array layout according to a first embodiment of the present invention respectively. As shown in FIGS. 4 & 5, the EEPROM of the present invention comprises: a plurality of parallel bit lines 14 (also shown as BL1 and BL2), that are classified into a plurality groups of bit lines 16, containing a first group bit line 18 and a second group bit line 19, both include a bit line 14; a plurality of parallel word lines 20, arranged perpendicular to the bit lines 14, and containing a first word line 22 (also shown as WL1); a plurality of parallel common source lines 24, containing a first common source line 26 (also shown as SL1), and are arranged parallel to the word lines 20; and a plurality of sub-memory arrays 28, namely a 2×2 bit memory cell, connected to the bit lines 14, a word line 20, and a common source line 24, such that each sub-memory array 28 is connected to two group of bit lines 16, two word lines 20, and a common source line 24; and each sub-memory array 28 is located between two adjacent group of bit lines 16. Since the connections of each sub-memory array 28 to bit lines 16, two word lines 20, and a common source line 24 are similar, they are described in detail as follows.

Figure 6:
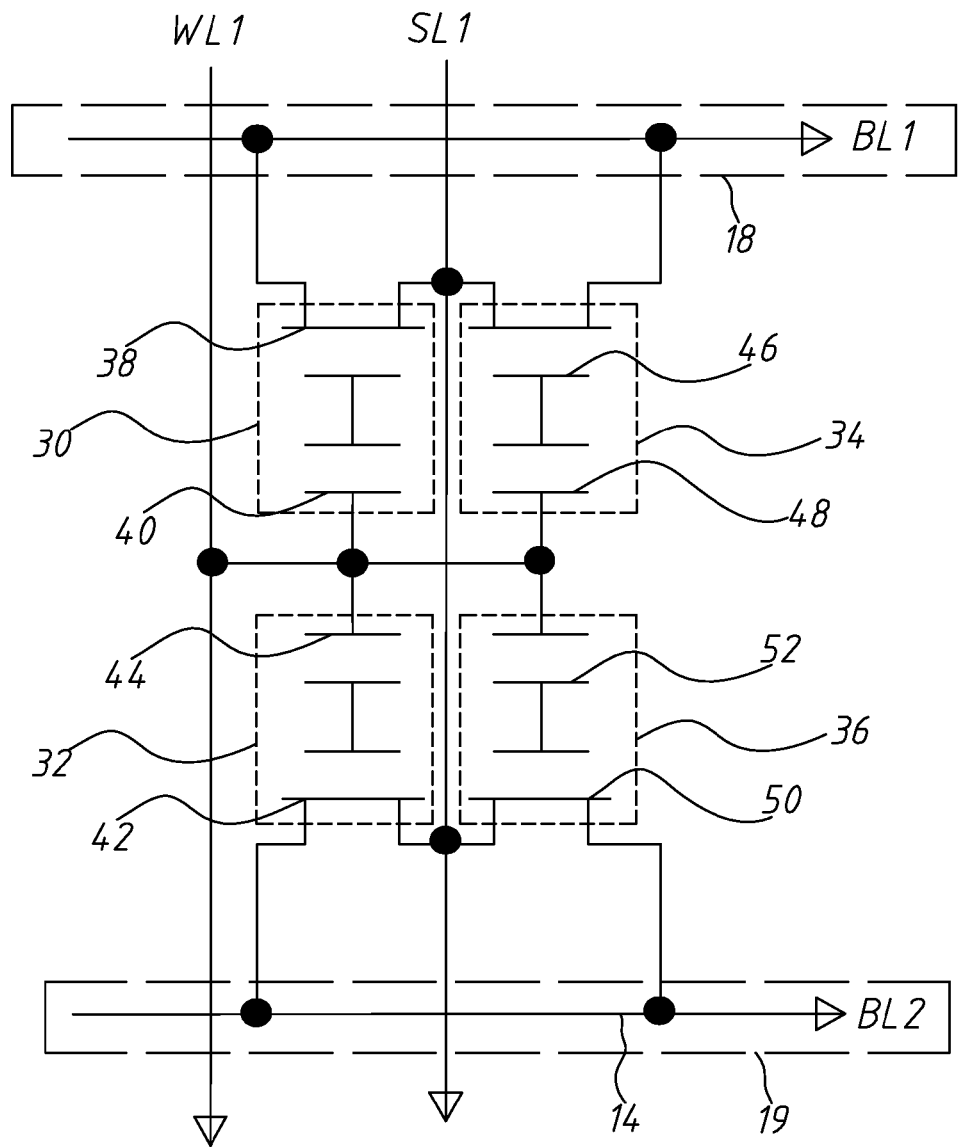
FIG. 6 is a circuit diagram of a sub-memory array according to a first embodiment the present invention.

Refer to FIGS. 5 & 6 for a circuit diagram of an area saving electrically-erasable programmable read-only memory (EEPROM) array layout according to a first embodiment of the present invention; and a circuit diagram of a sub-memory array according to a first embodiment the present invention respectively. As shown in FIGS. 5 & 6, each first sub-memory cell array 28 comprises a first, second, third, and fourth memory cells 30,32,34, and 36, and is located between the first group bit line 18 and the second bit lines 19. The first memory cell 30 is connected to a bit line 14 of a first group bit line 18, a first common source line 26, and a first word line 22; the second memory cell 32 is connected to a bit line 14 of a second group bit line 19, a first common source line 26, and a first word line 22; the first memory cell 32 and the second memory cell 34 are arranged to be symmetric to each other, and are located on the same side of the first common source line 26. The third memory cell 34 is connected to a bit line 14 of a first group bit line 18, a first common source line 26, and a first word line 22, and is arranged to be symmetric to the first memory cell 30 with the first common source line 26 as a symmetric axis; and the fourth memory cell 36 is connected to a bit line 14 of a second group bit line 19, a first common source line 26, and a first word line 22, and is arranged to be symmetric to the second memory cell 32 with the first common source line 26 as a symmetric axis;

the fourth memory cell 36 and the third memory cell 34 are arranged to be symmetric to each other, such that the first and second memory cells 30 and 32 are located on two different sides of the first common source line 26, just as the fourth and third memory cells 36 and 34 are located on two different sides of the first common source line 26.

Since first, second, third, and fourth memory cells 30,32, 34, and 36 are arranged to be symmetric to each other, and they all connected to a first word line 22, thus they may share a common connection point along the first word line 22. In addition, in two adjacent sub-memory arrays 28, two third memory cells 34 are adjacent to each other and are connected to a same bit line 14, so as to share a common connection point; and two fourth memory cells 36 are adjacent to each other and are connected to a same bit line 14, thus sharing a common connection point; therefore, utilizing this kind of common connection point arrangement, the entire area of layout can be reduced.

The first memory cell 30 further comprises a field effect transistor 38 and a capacitor 40, the field effect transistor 38 has a conductive gate, with its drain connected to a bit line 14 of the first group bit line 18, and with its source connected to a first common source line 26, the voltage of the first word line 22 is coupled to the field effect transistor 38 through the capacitor 40 made of the same polysilicon as the conductive gate. The field effect transistor 38 receives voltage of the first common source line 26 and voltage of the bit line 14 of the first group bit line 18, as such performing memory data writing through controlling the conductive gate of field effect transistor 38, or performing memory data erasing through controlling the conductive gate of field effect transistor 38.

The second memory cell 32 further comprises a field effect transistor 42 and a capacitor 44, the field effect transistor 42 has a conductive gate, with its drain connected to a bit line 14 of the second group bit line 19, and with its source connected to a first common source line 26, the voltage of the first word line 22 is coupled to the field effect transistor 42 through the capacitor 44 made of the same polysilicon as the conductive gate. The capacitor 44 is connected directly to the capacitor 40, and between the field effect transistor 38 and the field effect transistor 42. The field effect transistor 42 receives voltage of the first common source line 26 and voltage of the bit line 14 of the second group bit line 19, as such performing memory data writing through controlling the conductive gate of field effect transistor 42, or performing memory data erasing through controlling the conductive gate of field effect transistor 42.

The third memory cell 34 further comprises a field effect transistor 46 and a capacitor 48, the field effect transistor 46 has a conductive gate, with its drain connected to a bit line 14 of the first group bit line 18, and with its source connected to a first common source line 26, so as to share a common connection point with the first memory cell 30. The voltage of the first word line 22 is coupled to the field effect transistor 46 through the capacitor 48 made of the same polysilicon as the conductive gate. The capacitor 48 and the field effect transistor 46 are arranged to be symmetric respectively to the capacitor 40 and the field effect transistor 38, with the first common source line 26 as an axis. The field effect transistor 46 receives voltage of the first common source line 26 and voltage of the bit line 14 of the first group bit line 18, as such performing memory data writing through controlling the conductive gate of field effect transistor 46, or performing memory data erasing through controlling the conductive gate of field effect transistor 46.

The fourth memory cell 36 further comprises a field effect transistor 50 and a capacitor 52, the field effect transistor 50 has a conductive gate, with its drain connected to a bit line 14 of the second group bit line 19, and with its source connected to a first common source line 26, so as to share a common connection point with the second memory cell 32. The voltage of the first word line 22 is coupled to the field effect transistor 50 through the capacitor 52 made of the same polysilicon as the conductive gate. The capacitor 52 and the field effect transistor 50 are located to be symmetric respectively to the capacitor 44 and the field effect transistor 42, with the first common source line 26 as an axis. The capacitor 52 is connected directly to the capacitor 48, and between the field effect transistor 50 and the field effect transistor 46. The field effect transistor 46 receives voltage of the first common source line 26 and voltage of the bit line 14 of the second group bit line 19, as such performing memory data writing through controlling the conductive gate of field effect transistor 46, or performing memory data erasing through controlling the conductive gate of field effect transistor 46.

Since the capacitors 40,44,48,52 are all connected to the first word line 22, thus they may share a common gate connection point 54 along the first word line 22. In addition, in two adjacent sub-memory arrays 28, two field effect transistors 46 are adjacent to each other, and are connected to the same bit line 14, so as to share a common drain connection point 56; and two field effect transistors 50 are adjacent to each other, and are connected to the same bit line 14, so as to share a common drain connection point 56. As such, through this way of sharing connection point, the area of overall layout can be reduced, hereby reducing the production cost significantly.

Refer again to FIG. 4, the field effect transistors 38,42,46, 50 mentioned above can be N-type field effect transistors each located in a P-type well region or in a P-type substrate. Or, alternatively, they may each be a P-type field effect transistor located in an N-type well region or in an N-type substrate. In the present invention, the operations for N-type field effect transistor and P-type field effect transistor are different. In the following, the operations of field effect transistors 38,42,46,50 as N-type field effect transistors are first described. In order to understand the ways of operations, the names of various memory cells are first clearly defined as follows.

In the description mentioned above, the first, second, third, and fourth memory cells 30,32,34,36 can all be considered as operation memory cells, and one of the operation memory cells can be chosen as the selected memory cell to proceed with the operations as required. As to the operation memory cells, that are connected to the same bit line 14 connecting to the selected memory cell, but not connected to the same common source line 24 connecting to the selected memory cell, are referred to as a plurality of common bit memory cells; and the operation memory cells, that are connected to the same word line 20 connecting to the selected memory cell, are referred to as a plurality of common word memory cells; and the rest of the operation memory cells are referred to as a plurality of unselected memory cells.

In the following, the operations of the first embodiment are described, such that in this way of operation, other un-selected memory cells not connected to the same common source line and same bit line connecting to the selected memory cell will not be affected.

Figure 6B:
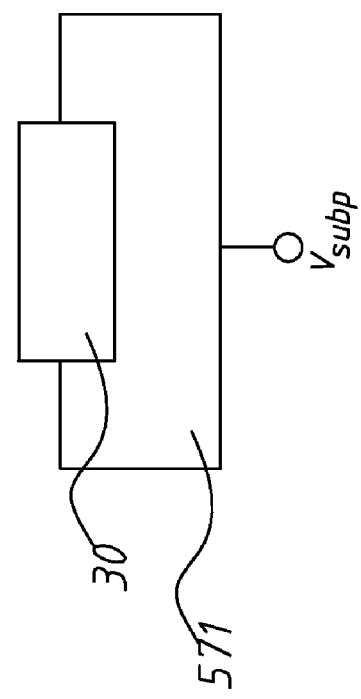
FIG. 6B is a cross section view of the first memory cell formed in a P-type well region according to the present invention.
Figure 6A:
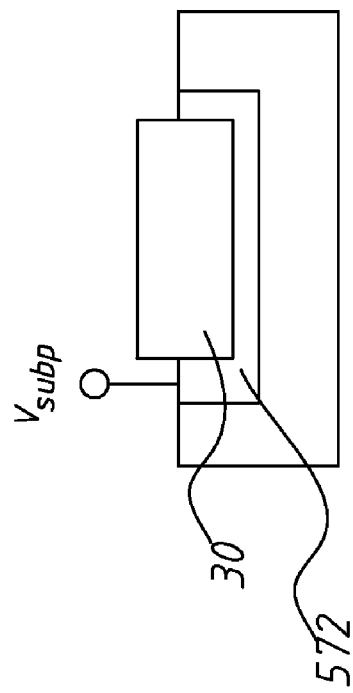
FIG. 6A is a cross section view of a first memory cell formed in a P-type substrate according to the present invention.

Referring to FIGS. 4, 6A and 6B, the first memory cell 30 at upper-lift corner is chosen as the selected memory cell. When operating on said selected memory cell, performing the following voltage applications as required: applying a substrate voltage $V_{subp}$ on a P-type well region 572 or a P-type substrate 571 connecting to a selected memory cell; applying a first bit voltage $V_{b1}$, a first word voltage $V_{w1}$, a first common source voltage $V_{s1}$ on a bit line 14, a word line 20, and a common source line 24, all connecting to the selected memory cell; applying second word voltage $V_{w2}$, a second common source voltage $V_{s2}$ respectively on the word line 20 and the common source line 24, both connecting to each common bit memory cell; applying a second bit voltage $V_{b2}$, a first common source voltage $V_{s1}$ on a bit line 14, and a common source line 24, both connecting to each common word memory cell; and applying a second bit voltage $V_{b2}$, a second word voltage $V_{w2}$, and a second common source voltage $V_{s2}$ on the bit line 14, the word line 20, and the common source line 24, all three connecting to each un-selected memory cell. then in writing data into a memory, the following conditions must be satisfied: $V_{subp}$ is a ground voltage, $V_{b2}$ is floating, $V_{b1}>V_{s1}$, $V_{w1}>V_{s1}$, $V_{b1}>V_{s1}>0$, $V_{b1}>V_{w2}>0$, $V_{b1}>V_{s2}>0$; and in erasing data from the memory, the following conditions must be satisfied: $V_{subp}$ is a ground voltage, $V_{s1}$ is a ground voltage, $V_{b2}$ is floating, $V_{b1}>V_{w2}>V_{w1}\geq 0$, and $V_{b1}>V_{s2}>V_{w1}\geq 0$.

Figure 6C:
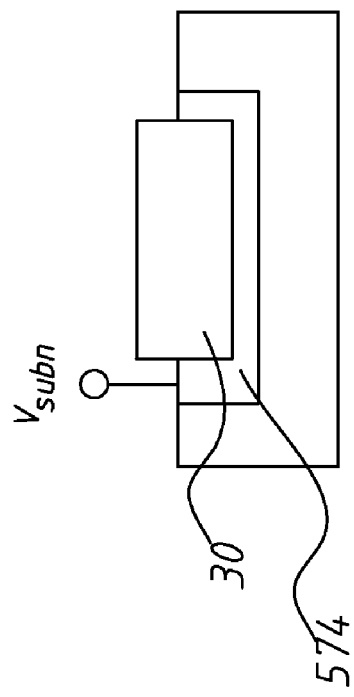
FIG. 6C is a cross section view of the first memory cell formed in a N-type substrate according to the present invention.
Figure 6D:
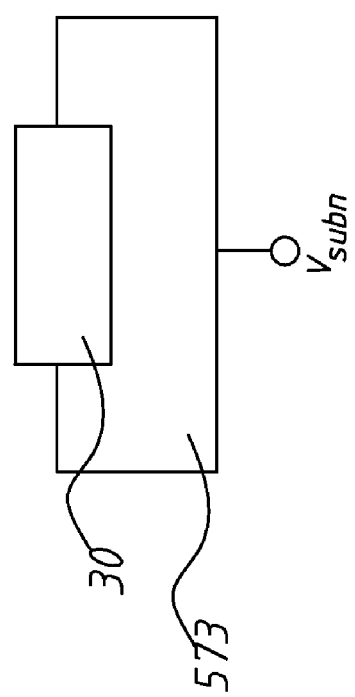
FIG. 6D is a cross section view of the first memory cell formed in a N-type well region according to the present invention.

Referring to FIGS. 4, 6C and 6D, in the case when the field effect transistors 38,42,46,50 are P-type field effect transistors, then according to the definitions of the memory cells and voltages mentioned above, when in operations, performing the following voltage applications as required: applying a substrate voltage $V_{subn}$ on an N-type well region 574 or an N-type substrate 573 connecting to a selected memory cell, such that in writing data into a memory, the following conditions must be satisfied: $V_{b2}$ is floating, $V_{subn}>V_{s1}>V_{b1}$, $V_{subn}>V_{s1}>V_{w1}$, $V_{subn}>V_{s2}>V_{b1}$, $V_{subn}>V_{w2}>V_{b1}$; and in erasing data from the memory, the following conditions must be satisfied: $V_{b2}$ is floating, $V_{subn}=V_{s1}>V_{w1}>V_{b1}$, $V_{subn}>V_{s2}>V_{b1}$, and $V_{subn}>V_{w2}>V_{b1}$.

To the same sub-memory array 28, a same bit line 14 is connected to two memory cells, therefore, in memory data writing or erasing, each time it is performed on a byte of memory cell, and not on a single bit of memory cell. As such, through the ways of voltage applications mentioned above, byte writing and byte erasing of non-volatile memory can be achieved without the need to add any additional isolating transistors.

Figure 7:
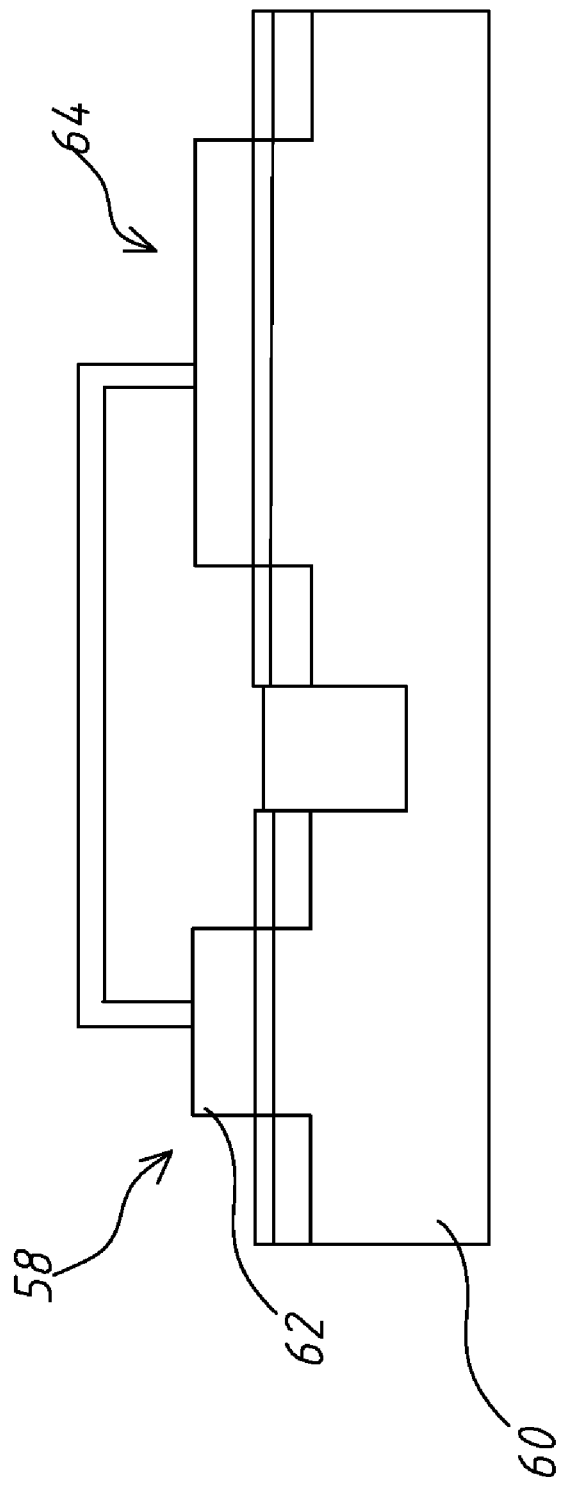
FIG. 7 is a cross section view of a structure of an N-type field effect transistor and a capacitor according to the present invention.

In the following, refer to FIG. 7 for a cross section view of a structure of field effect transistors 38,42,46,50 and capacitors 40,44,48,52 according to an embodiment of the present invention, and in this case, an N-type field effect transistor is taken as an example for explanation. As shown in FIG. 7, the N-type field effect transistor 58 is disposed in a P-type semiconductor substrate 60, and has a conductive gate 62; meanwhile, another capacitor 64 is disposed with an N-type field effect transistor 58 horizontally in the P-type semiconductor substrate 60, wherein, the capacitor 64 and conductive gate are both made of polysilicon. In case that an N-type semiconductor substrate is utilized, then a P-type well region can be provided in the substrate, then the N-type field effect transistor 58 can be disposed in the P-well region.

Figure 8:
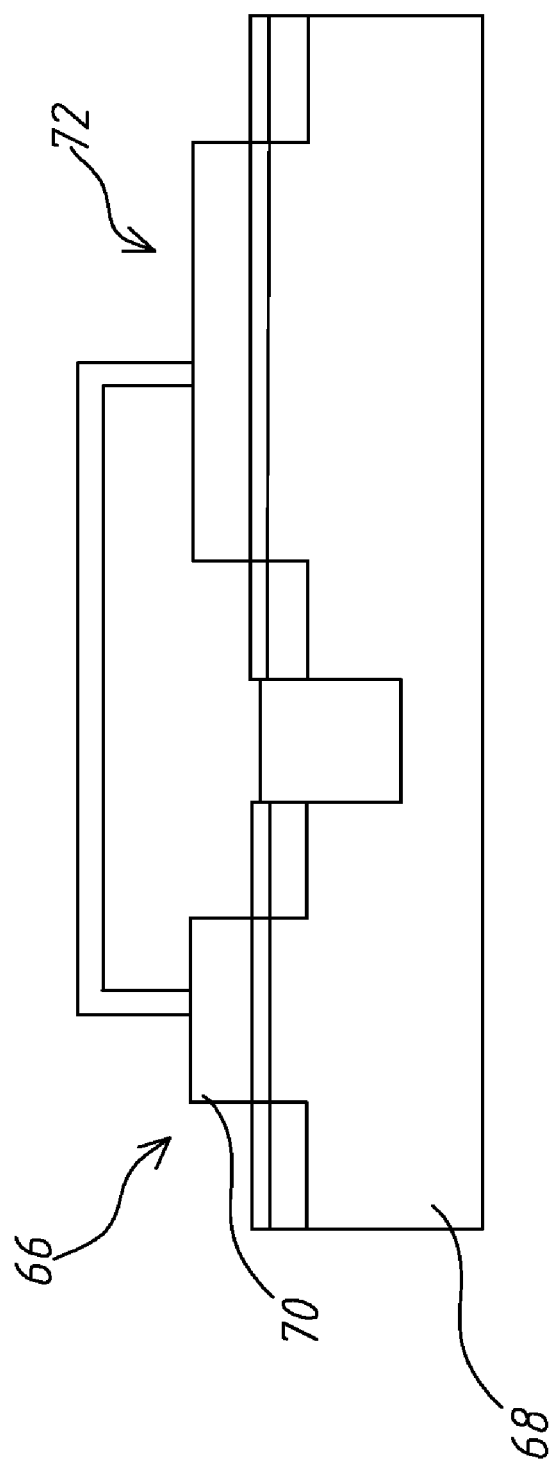
FIG. 8 is a cross section view of a structure of a P-type field effect transistor and a capacitor according to the present invention.

Similarly, refer to FIG. 8 for a cross section view of a structure of field effect transistors 38,42,46,50 and capacitors 40,44,48,52 according to an embodiment of the present invention, and in this case, a P-type field effect transistor is taken as an example for explanation. As shown in FIG. 8, the P-type field effect transistor 66 is disposed in an N-type semiconductor substrate 68, and has a conductive gate 70; meanwhile, another capacitor 72 is disposed with the P-type field effect transistor 66 horizontally in an N-type semiconductor substrate 68, wherein, the capacitor 72 and conductive gate are both made of polysilicon. In case that a P-type semiconductor substrate is utilized, then an N-type well region can be provided in the substrate, then the P-type field effect transistor 66 can be disposed in the N-type well region.

Figure 9:
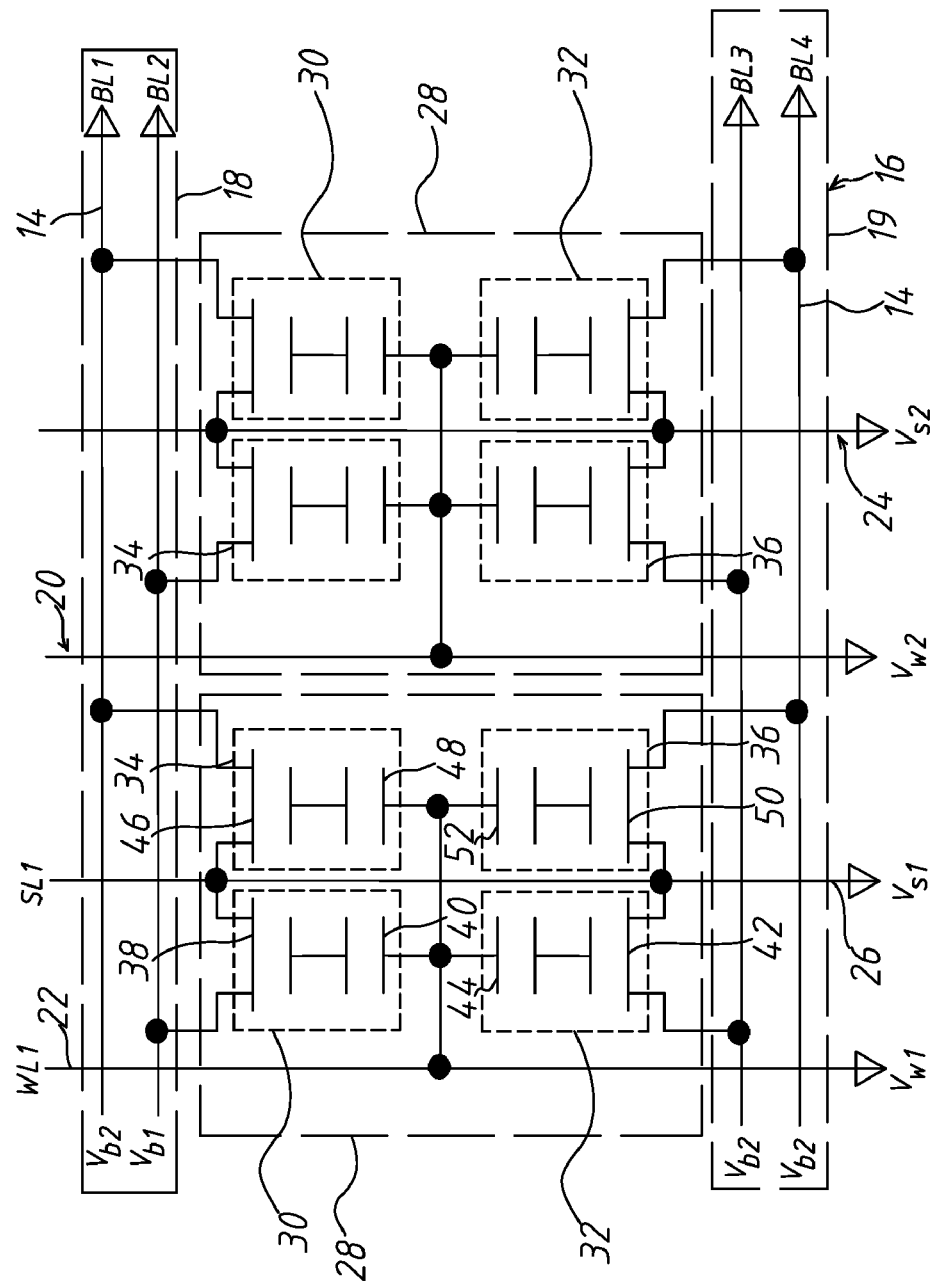
FIG. 9 is a circuit diagram of an area saving electrically-erasable programmable read-only memory (EEPROM) array according to a second embodiment of the present invention.
Figure 10:
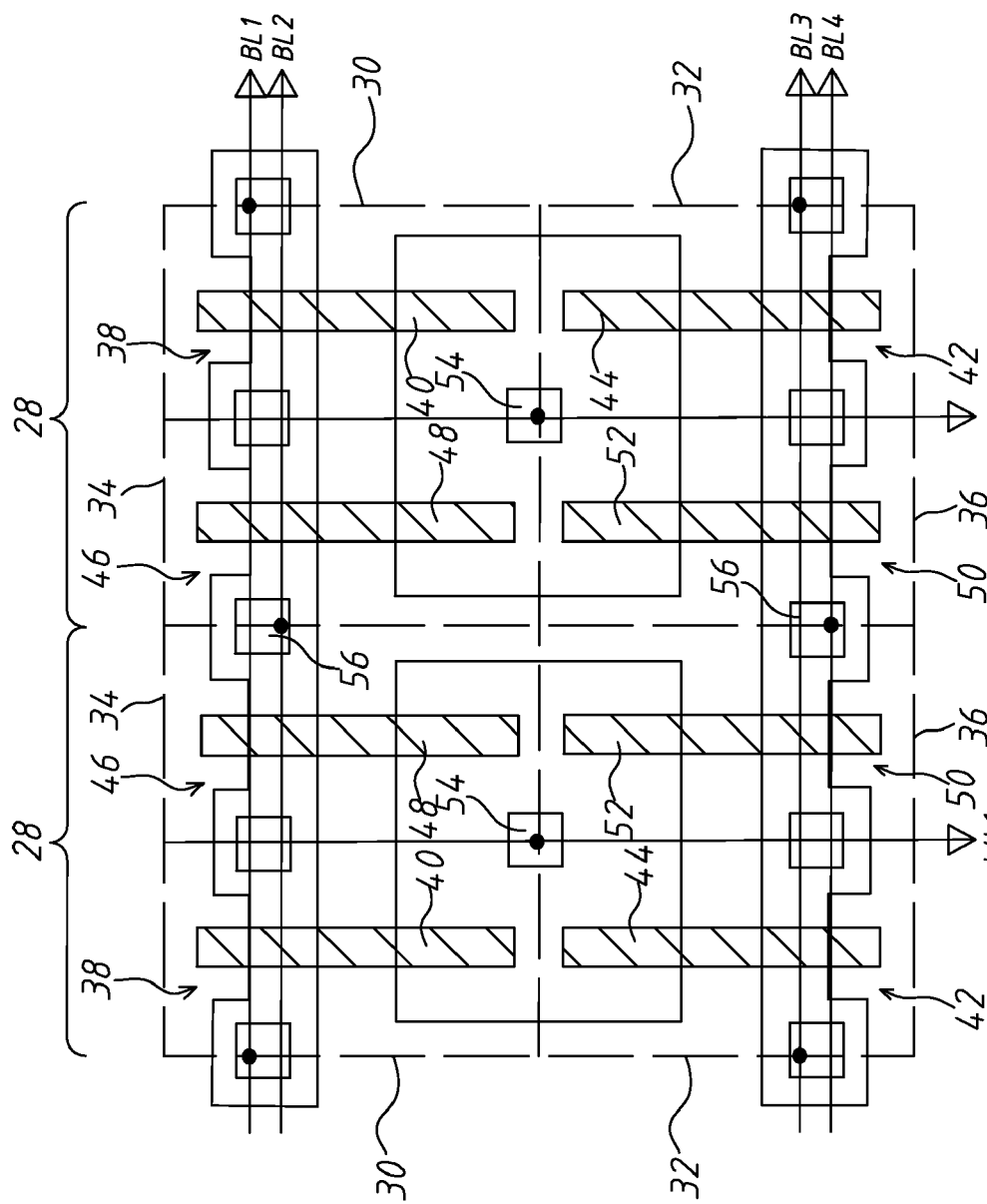
FIG. 10 is a circuit diagram of an area saving electrically-erasable programmable read-only memory (EEPROM) array layout according to a second embodiment of the present invention.
Figure 11:
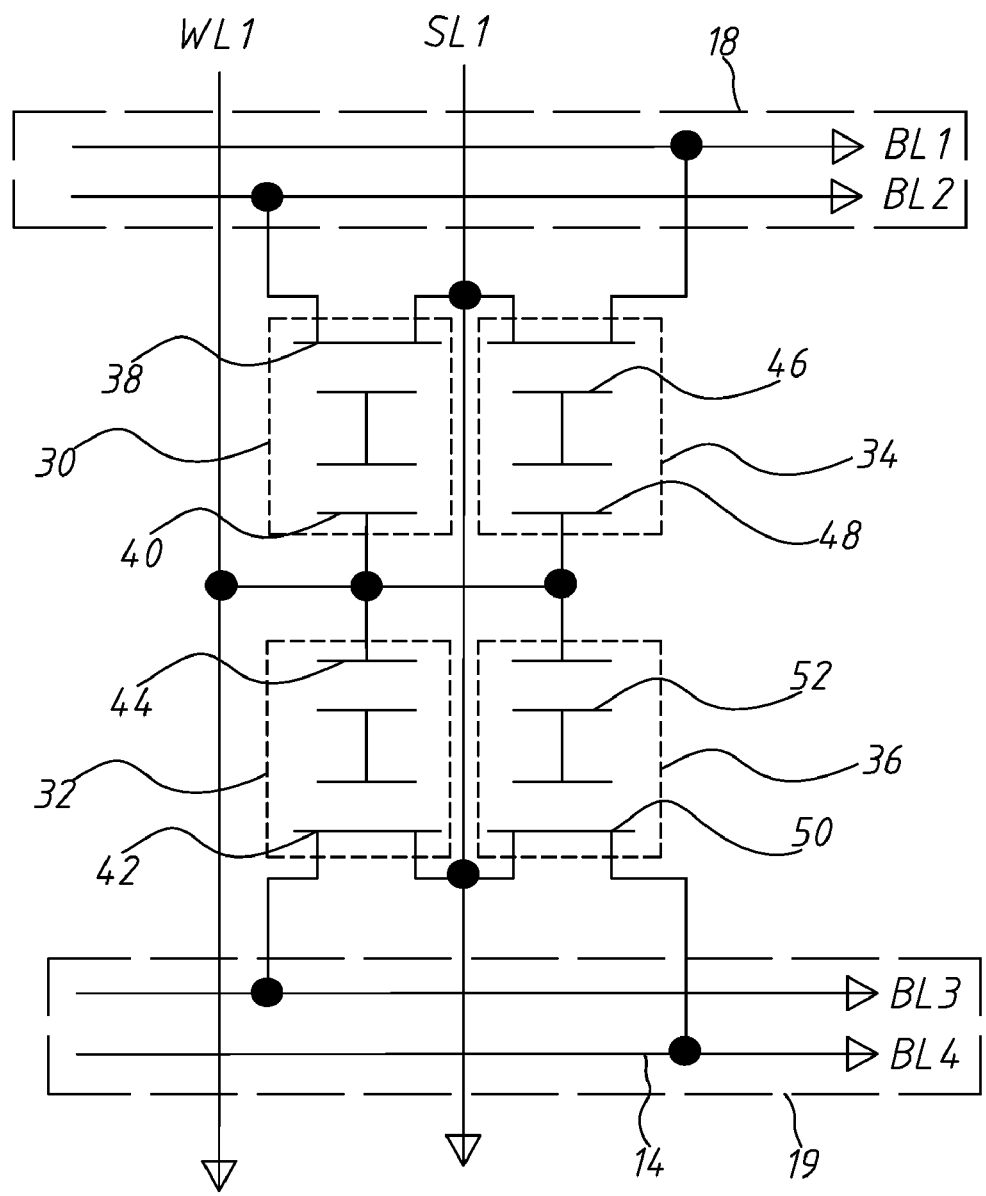
FIG. 11 is a circuit diagram of a sub-memory array according to a second embodiment the present invention.

In order to performing operations on a specific single memory cell, a second embodiment is described as follows. Refer to FIGS. 9, 10, and 11 at the same time for a circuit diagram of an area saving electrically-erasable programmable read-only memory (EEPROM) array according to a second embodiment of the present invention; a circuit layout diagram of an area saving electrically-erasable-programmable read-only memory (EEPROM) array layout according to a second embodiment of the present invention; and a circuit diagram of a sub-memory array according to a second embodiment the present invention respectively. The difference between the second embodiment and the first embodiment is that: in the former case, each group of bit lines 16 contains two bit lines 14, therefore, the first group bit line 18 also contains two bit lines 14 (also shown as BL1 and BL2), connected respectively to the first and third memory cells 30 and 34 of the same sub-memory array 28; the second group bit line 19 also contains two bit lines 14 (also shown as BL3 and BL4), connected respectively to the second and fourth memory cells 32 and 36 of the same sub-memory array 28. Furthermore, in two adjacent sub-memory arrays 28, two third memory cells 34 are adjacent to each other and are connected to a same bit line 14 in sharing a same connection point, and two fourth memory cells 36 are adjacent to each other and are connected to a same bit line 14 in sharing a same connection point. In other words, field effect transistors 46 of two third memory cells 34 are adjacent to each other and are connected to a same bit line 14 for sharing the same drain connection point 56; and field effect transistors 50 of two fourth memory cells 36 are adjacent to each other and are connected to a same bit line 14 for sharing the same drain connection point 56, as such reducing the area of overall layout required.

Refer again to FIG. 9, the field effect transistors 38,42,46,50 mentioned above can each be an N-type field effect transistor located in a P-type well region or in a P-type substrate. Or, alternatively, they may be P-type field effect transistors each located in an N-type well region or in an N-type substrate. In the present embodiment, the operations for an N-type field effect transistor and a P-type field effect transistor are different. In the following, the operations of field effect transistors 38,42,46,50 as N-type field effect transistors are first described. In order to understand the ways of operations, the names of various memory cells are first clearly defined as follows.

In the description mentioned above, the first, second, third, and fourth memory cells 30,32,34,36 can all be considered as operation memory cells, and one of the operation memory cells can be chosen as the selected memory cell to proceed with the operations as required. As to the operation memory cells, that are connected to the same bit line 14 connecting to the selected memory cell, are referred to as a plurality of common bit memory cells; and the operation memory cells, that are connected to the same word line 20 connecting to the selected memory cell, are referred to as a plurality of common word memory cells; and the rest of the operation memory cells are referred to as a plurality of unselected memory cells.

In the following, the operations of the second embodiment are described, such that in this way of operation, other un-selected memory cells will not be affected, so as to operate a specific single memory cell.

When operating on said selected memory cells, performing the following voltage applications as required: applying a substrate voltage $V_{subp}$ on a P-type well region or a P-type substrate connecting to a selected memory cell; applying a first bit voltage $V_{b1}$, a first word voltage $V_{w1}$, a first common source voltage $V_{s1}$ on a bit line 14, a word line 20, and a common source line 24, all connecting to the selected memory cell; applying second word voltage $V_{w2}$, a second common source voltage $V_{s2}$ respectively on the word line 20 and the common source line 24 connecting to each common bit memory cell; applying a second bit voltage $V_{b2}$, a first common source voltage $V_{s1}$ on the bit line 14 and the common source line 24 connecting both to each common word memory cell; and applying a second bit voltage $V_{b2}$, a second word voltage $V_{w2}$, and a second common source voltage $V_{s2}$ on the bit line 14, the word line 20, and the common source line 24, all three connecting to each un-selected memory cell. Then in writing data into a memory, the following conditions must be satisfied: $V_{subp}$ is a ground voltage, $V_{b2}$ is floating, $V_{b1} > V_{s1}$, $V_{w1} > V_{s1}$, $V_{b1} > V_{s1} > 0$, $V_{b1} > V_{w2} \geq 0$, $V_{b1} > V_{s2} > 0$; and in erasing data from the memory, the following conditions must be satisfied: $V_{subp}$ is a ground voltage, $V_{s1}$ is a ground voltage, $V_{b2}$ is floating, $V_{b1} > V_{w2} > V_{w1} \geq 0$, and $V_{b1} > V_{s2} > V_{w1} \geq 0$.

In case that the field effect transistors 38,42,46,50 are P-type field effect transistors, then according to the definitions of the memory cell and voltage mentioned above, when in operations, performing the following voltage applications as required: applying a substrate voltage $V_{subn}$ on an N-type well region or an N-type substrate connecting to a selected memory cell, such that in writing data into a memory, the following conditions must be satisfied: $V_{b2}$ is floating, $V_{subn} > V_{s1} > V_{b1}$, $V_{subn} > V_{s1} > V_{w1}$, $V_{subn} > V_{s2} > V_{b1}$, $V_{subn} > V_{w2} > V_{b1}$; and in erasing data from the memory, the following conditions must be satisfied: $V_{b2}$ is floating, $V_{subn} = V_{s1} \geq V_{w1} > V_{b1}$, $V_{subn} > V_{s2} > V_{b1}$, and $V_{subn} > V_{w2} > V_{b1}$.

In this way of voltage applications mentioned above, the byte-writing and byte-erasing of the non-volatile memory data can be realized without the need to add any additional components to insolate the transistors.

The cross section view of the structure of the field effect transistors 38,42,46,50 and capacitors 40,44,48,52 of the second embodiment is the same as that of the first embodiment, and it will not be repeated here for brevity.

Summing up the above, the advantage of the present invention is that, it is capable of providing an EEPROM structure having smaller area by means of common connection point, as such achieving byte-writing and byte-erasing of data in a memory through applying voltages of various levels.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. An area saving electrically-erasable-programmable read-only memory (EEPROM) array, comprising:
    a plurality of parallel bit lines, that are classified into a plurality groups of bit lines, containing a first group bit line and a second group bit line;

a plurality of parallel word lines, arranged perpendicular to said bit lines, and containing a first word line;
a plurality of parallel common source lines, arranged parallel with said word line, containing a first common source line; and
a plurality of sub-memory arrays, each is connected to two group of said bit lines, said word lines, and said common source line, each said sub-memory array includes:
a first memory cell, connected to said first group bit line, said first common source line, and said first word line;
a second memory cell, connected to said second group bit line, said first common source line, and said first word line, said first memory cell and said second memory cell are arranged to be symmetric to each other, and are located on a same side of said first common source line;
a third memory cell, connected to said first group bit line, said first common source line, and said first word line, and is arranged to be symmetric to said first memory cell with said first common source line as an axis; and
a fourth memory cell, connected to said second group bit line, said first common source line, and said first word line, and is arranged to be symmetric to said second memory cell with said first common source line as said axis, said third memory cell and said fourth memory cell are arranged to be symmetric to each other, and are located on two different sides of said first common source line, just as said first and said second memory cells are located on said two different sides of said first common source line.

2. The area saving electrically-erasable-programmable read-only memory (EEPROM) array as claimed in claim 1, wherein
each said sub-memory array is located between two adjacent group of said bit lines.

3. The area saving electrically-erasable-programmable read-only memory (EEPROM) array as claimed in claim 1, wherein
said first, second, third, and fourth memory cells are connected to said first word line in sharing a same connection point.

4. The area saving electrically-erasable-programmable read-only memory (EEPROM) array as claimed in claim 1, wherein
said first group bit line includes one said bit line, connected to said first and said third memory cells; and said second group bit line includes one said bit line, connected to said second and said fourth memory cells.

5. The area saving electrically-erasable-programmable read-only memory (EEPROM) array as claimed in claim 1, wherein
said first group bit line includes two said bit lines, connected respectively to said first and third memory cells; and said second group bit line includes two said bit lines, connected respectively to said second and fourth memory cells.

6. The area saving electrically-erasable-programmable read-only memory (EEPROM) array as claimed in claim 4, wherein
in two adjacent said sub-memory arrays, two said third memory cells are adjacent to each other, and are connected to said same bit line for sharing a same connection point, and two said fourth memory cells are adjacent to each other, and are connected to said same bit line for sharing said same connection point.

7. The area saving electrically-erasable-programmable read-only memory (EEPROM) array as claimed in claim 5, wherein
in two adjacent said sub-memory arrays, two said third memory cells are adjacent to each other, and are connected to said same bit line for sharing a same connection point, and two said fourth memory cells are adjacent to each other, and are connected to said same bit line for sharing said same connection point.

8. The area saving electrically-erasable-programmable read-only memory (EEPROM) array as claimed in claim 4, wherein
in case that said first, second, third, and fourth memory cells all contain an N-type field effect transistor in a P-type substrate or in a P-type well region, said first, second, third, and fourth memory cells are all operation memory cells, and one of said operation memory cells is chosen as a selected memory cell to proceed with operations as required, as to said operation memory cells, that are connected to said same bit line connecting to said selected memory cell, but not connected to said same common source line connecting to said selected memory cell, are referred to as a plurality of common bit memory cells; and said operation memory cells, that are connected to said same word line connecting to said selected memory cell, are referred to as a plurality of common word memory cells; and rest of operation memory cells are referred to as a plurality of unselected memory cells, when operating on said selected memory cells, performing following voltage applications as required:
applying a substrate voltage $V_{subp}$ on said P-type well region or said P-type substrate connecting to said selected memory cell; applying a first bit voltage $V_{b1}$, a first word voltage $V_{w1}$, a first common source voltage $V_{s1}$ on said bit line, said word line, and said common source line, all connecting to said selected memory cell; applying a second word voltage $V_{w2}$, a second common source voltage $V_{s2}$ respectively on said word line and said common source line, both connecting to each said common bit memory cell; applying a second bit voltage $V_{b2}$, said first common source voltage $V_{s1}$ on said bit line and said common source line, both connecting to each said common word memory cell; and applying said second bit voltage $V_{b2}$, said second word voltage $V_{w2}$, and a second common source voltage $V_{s2}$ on said bit line, said word line, and said common source line, all three connecting to each said un-selected memory cell, such that
in writing data into a memory, following conditions are satisfied: $V_{subp}$ is a ground voltage, $V_{b2}$ is floating, $V_{b1} > V_{s1}$, $V_{w1} > V_{s1}$, $V_{b1} > V_{s1} > 0$, $V_{b1} > V_{w2} \geq 0$, $V_{b1} > V_{s2} > 0$; and
in erasing data from the memory, said following conditions are satisfied: $V_{subp}$ is a ground voltage, $V_{s1}$ is a ground voltage, $V_{b2}$ is floating, $V_{b1} > V_{w2} > V_{w1} \geq 0$, and $V_{b1} > V_{s2} > V_{w1} \geq 0$.

9. The area saving electrically-erasable-programmable read-only memory (EEPROM) array as claimed in claim 4, wherein
in case that said first, second, third, fourth memory cells all contains a P-type field effect transistor in an N-type substrate or in an N-type well region, said first, second, third, and fourth memory cells are said operation memory cells, and one of said operation memory cells is chosen as said selected memory cell to proceed with operations as required, as to said operation memory cells, that are connected to said same bit line connecting to said selected memory cell, but not connected to said same common source line connecting to said selected memory cell, are referred to as a plurality of said common bit memory cells; and said operation memory cells, that are connected to said same word line connecting to the selected memory cell, are referred to as a plurality of said common word memory cells; and rest of said operation memory cells are referred to as a plurality of said unselected memory cells, when operating on said selected memory cells, performing following voltage applications as required:

applying a substrate voltage $V_{subn}$ on said N-type well region or said N-type substrate connecting to said selected memory cell; applying said first bit voltage $V_{b1}$, said first word voltage $V_{w1}$, said first common source voltage $V_{s1}$ on said bit line, said word line, and said common source line, all connecting to said selected memory cell; applying said second word voltage $V_{w2}$, said second common source voltage $V_{s2}$ respectively on said word line and said common source line, both connecting to each said common bit memory cell; applying said second bit voltage $V_{b2}$, said first common source voltage $V_{s1}$ on said bit line and said common source line, connecting both to each said common word memory cell; and applying said second bit voltage $V_{b2}$, said second word voltage $V_{w2}$, and a second common source voltage $V_{s2}$ on said bit line, said word line, and said common source line, all three connecting to each said un-selected memory cell, such that in writing data into said memory, said following conditions are satisfied:

$V_{b2}$ is floating, $V_{subn} > V_{s1} > V_{b1}$, $V_{subn} > V_{s1} > V_{w1}$, $V_{subn} > V_{s2} > V_{b1}$, $V_{subn} > V_{w2} > V_{b1}$; and in erasing data from said memory, said following conditions are satisfied:

$V_{b2}$ is floating, $V_{subn} = V_{s1} \geqq V_{w1} > V_{b1}$, $V_{subn} > V_{s2} > V_{b1}$, and $V_{subn} > V_{w2} > V_{b1}$.

10. The area saving electrically-erasable-programmable read-only memory (EEPROM) array as claimed in claim 5, wherein in case that said first, second, third, fourth memory cells all contains said N-type field effect transistor in said P-type substrate or in said P-type well region, said first, second, third, and fourth memory cells are said operation memory cells, and one of said operation memory cells is chosen as said selected memory cell to proceed with operations as required, as to said operation memory cells, that are connected to said same bit line connecting to said selected memory cell are referred to as a plurality of said common bit memory cells; and said operation memory cells, that are connected to said same word line connecting to the selected memory cell, are referred to as a plurality of said common word memory cells; and rest of said operation memory cells are referred to as a plurality of said unselected memory cells, when operating on said selected memory cells, performing following voltage applications as required:

applying said substrate voltage $V_{subp}$ on said P-type well region or said P-type substrate connecting to said selected memory cell; applying said first bit voltage $V_{b1}$, said first word voltage $V_{w1}$, said first common source voltage $V_{s1}$ on said bit line, said word line, and said common source line, all three connecting to said selected memory cell; applying said second word voltage $V_{w2}$, said second common source voltage $V_{s2}$ respectively on said word line and said common source line, both connecting to each said common bit memory cell; applying said second bit voltage $V_{b2}$, said first common source voltage $V_{s1}$ on said bit line and said common source line, both connecting to each said common word memory cell; and applying said second bit voltage $V_{b2}$, said second word voltage $V_{w2}$, and said second common source voltage $V_{s2}$ on said bit line, said word line, and said common source line, all three connecting to each said unselected memory cell, such that, in writing data into said memory, said following conditions are satisfied:

$V_{subp}$ is a ground voltage, and $V_{b2}$ is floating, $V_{b1} > V_{s1}, V_{w1} > V_{s1}, V_{b1} > V_{s1} > 0, V_{b1} > V_{w2} > 0, V_{b1} > V_{s2} > 0$; and in erasing data from said memory, said following conditions are satisfied:

$V_{subp}$ is a ground voltage, $V_{s1}$ is a ground voltage, $V_{b2}$ is floating, $V_{b1} > V_{w2} > V_{w1} \geqq 0$, and $V_{b1} > V_{s2} > V_{w1} \geqq 0$.

11. The area saving electrically-erasable-programmable read-only memory (EEPROM) array as claimed in claim 5, wherein in case that said first, second, third, fourth memory cells all contains said P-type field effect transistor in said N-type substrate or in said N-type well region, said first, second, third, and fourth memory cells are said operation memory cells, and one of said operation memory cells is chosen as said selected memory cell to proceed with operations as required, as to said operation memory cells, that are connected to said same bit line connecting to said selected memory cell are referred to as a plurality of said common bit memory cells; and said operation memory cells, that are connected to said same word line connecting to said selected memory cell, are referred to as a plurality of said common word memory cells; and rest of said operation memory cells are referred to as a plurality of said unselected memory cells, when operating on said selected memory cells, performing following voltage applications as required:

applying said substrate voltage $V_{subn}$ on said N-type well region or said N-type substrate connecting to said selected memory cell; applying said first bit voltage $V_{b1}$, said first word voltage $V_{w1}$, said first common source voltage $V_{s1}$ on said bit line, said word line, and said common source line, all three connecting to said selected memory cell; applying said second word voltage $V_{w2}$, said second common source voltage $V_{s2}$ respectively on said word line and said common source line, both connecting to each said common bit memory cell; applying said second bit voltage $V_{b2}$, said first common source voltage $V_{s1}$ on said bit line and said common source line, both connecting to each said common word memory cell; and applying said second bit voltage $V_{b2}$, said second word voltage $V_{w2}$, and said second common source voltage $V_{s2}$ on said bit line, said word line, and said common source line, all three connecting to each said unselected memory cell, such that, in writing data into said memory, said following conditions are satisfied:

$V_{b2}$ is floating, $V_{subn} > V_{s1} > V_{b1}$, $V_{subn} > V_{s1} > V_{w1}$, $V_{subn} > V_{s2} > V_{b1}$, $V_{subn} > V_{w2} > V_{b1}$; and in erasing data from said memory, said following conditions are satisfied:

$V_{b2}$ is floating, $V_{subn} = V_{s1} \geqq V_{w1} > V_{b1}$, $V_{subn} > V_{s2} > V_{b1}$, and $V_{subn} > V_{w2} > V_{b1}$.

12. The area saving electrically-erasable-programmable read-only memory (EEPROM) array as claimed in claim 1, wherein said first memory cell further comprises a field effect transistor, having a conductive gate, with its drain connected to said first group bit line, and with its source connected to said first common source line, voltage of said first word line is coupled to said field effect transistor through a capacitor made of a same poly-silicon as said conductive gate, said field effect transistor receives voltage of said first group bit line and voltage of said first common source line, as such performing memory data writing through controlling said conductive gate of said field effect transistor, or performing memory data erasing through controlling said conductive gate of said field effect transistor.

13. The area saving electrically-erasable-programmable read-only memory (EEPROM) array as claimed in claim 1, wherein
said second memory cell further comprises said field effect transistor, having a conductive gate, with its drain connected to said second group bit line, and with its source connected to said first common source line, voltage of said first word line is coupled to said field effect transistor through said capacitor made of said same poly-silicon as said conductive gate, said field effect transistor receives voltage of said second group bit line and voltage of said first common source line, as such performing memory data writing through controlling said conductive gate of said field effect transistor, or performing memory data erasing through controlling said conductive gate of said field effect transistor.

14. The area saving electrically-erasable-programmable read-only memory (EEPROM) array as claimed in claim 1, wherein
said third memory cell further comprises said field effect transistor, having a conductive gate, with its drain connected to said first group bit line, and with its source connected to said first common source line, voltage of said first word line is coupled to said field effect transistor through said capacitor made of said same poly-silicon as said conductive gate, said field effect transistor receives voltage of said first group bit line and voltage of said first common source line, as such performing memory data writing through controlling said conductive gate of said field effect transistor, or performing memory data erasing through controlling said conductive gate of said field effect transistor.

15. The area saving electrically-erasable-programmable read-only memory (EEPROM) array as claimed in claim 1, wherein
said fourth memory cell further comprises said field effect transistor, having a conductive gate, with its drain connected to said second group bit line, and with its source connected to said first common source line, voltage of said first word line is coupled to said field effect transistor through said capacitor made of said same poly-silicon as said conductive gate, said field effect transistor receives voltage of said second group bit line and voltage of said first common source line, as such performing memory data writing through controlling said conductive gate of said field effect transistor, or performing memory data erasing through controlling said conductive gate of said field effect transistor.

16. The area saving electrically-erasable-programmable read-only memory (EEPROM) array as claimed in claim 12, wherein
said field effect transistor is an N-type field effect transistor or a P-type field effect transistor.

17. The area saving electrically-erasable-programmable read-only memory (EEPROM) array as claimed in claim 13, wherein
said field effect transistor is an N-type field effect transistor or a P-type field effect transistor.

18. The area saving electrically-erasable-programmable read-only memory (EEPROM) array as claimed in claim 14, wherein
said field effect transistor is an N-type field effect transistor or a P-type field effect transistor.

19. The area saving electrically-erasable-programmable read-only memory (EEPROM) array as claimed in claim 15, wherein
said field effect transistor is an N-type field effect transistor or a P-type field effect transistor.

20. The area saving electrically-erasable-programmable read-only memory (EEPROM) array as claimed in claim 12, wherein
said field effect transistor and said capacitor are disposed horizontally in a semiconductor substrate.

21. The area saving electrically-erasable-programmable read-only memory (EEPROM) array as claimed in claim 13, wherein
said field effect transistor and said capacitor are disposed horizontally in a semiconductor substrate.

22. The area saving electrically-erasable-programmable read-only memory (EEPROM) array as claimed in claim 14, wherein
said field effect transistor and said capacitor are disposed horizontally in a semiconductor substrate.

23. The area saving electrically-erasable-programmable read-only memory (EEPROM) array as claimed in claim 15, wherein
said field effect transistor and said capacitor are disposed horizontally in a semiconductor substrate.

* * * * *